US011011525B2

(12) United States Patent
Lin et al.

(10) Patent No.: US 11,011,525 B2
(45) Date of Patent: May 18, 2021

(54) LANDING PAD STRUCTURE AND METHOD OF MANUFACTURING THE SAME

(71) Applicant: Winbond Electronics Corp., Taichung (TW)

(72) Inventors: Keng-Ping Lin, Taichung (TW); Tetsuharu Kurokawa, Taichung (TW); Tzu-Ming Ou Yang, Taichung (TW); Shu-Ming Li, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/554,643

(22) Filed: Aug. 29, 2019

(65) Prior Publication Data

US 2020/0219889 A1 Jul. 9, 2020

(30) Foreign Application Priority Data

Jan. 3, 2019 (TW) ................. 108100253

(51) Int. Cl.
*H01L 21/768* (2006.01)
*H01L 21/033* (2006.01)
*H01L 21/027* (2006.01)
*H01L 21/02* (2006.01)
*H01L 21/311* (2006.01)
*H01L 21/31* (2006.01)
*H01L 21/308* (2006.01)
*H01L 21/76* (2006.01)
(Continued)

(52) U.S. Cl.
CPC ...... *H01L 27/10894* (2013.01); *H01L 21/761* (2013.01); *H01L 27/10897* (2013.01); *H01L 29/0623* (2013.01)

(58) Field of Classification Search
CPC ................................................. H01L 21/0337
See application file for complete search history.

(56) References Cited

U.S. PATENT DOCUMENTS 9,634,063 B2 4/2017 Pellizzer et al.
2011/0256723 A1* 10/2011 Lee ..................... H01L 21/0337
438/694

(Continued)

FOREIGN PATENT DOCUMENTS

CN 104885230 9/2015
JP 2010283071 12/2010
(Continued)

OTHER PUBLICATIONS

"Office Action of Taiwan Counterpart Application," dated Aug. 12, 2019, p. 1-p. 3.

*Primary Examiner* — Omar F Mojaddedi
(74) *Attorney, Agent, or Firm* — JCIPRNET

(57) ABSTRACT

Provided is a landing pad structure including a substrate, a plurality of landing pads, a guard ring, and an edge pattern. The substrate includes a cell region, a periphery region, and a guard ring region located between the cell region and the periphery region. The landing pads are arranged on the substrate in the cell region in a hexagonal close packing (HCP) configuration. The guard ring is disposed on the substrate in the guard ring region in a strip form. The edge pattern is disposed on the substrate in the cell region and close to the guard ring region. A method of manufacturing the landing pad structure is also provided.

7 Claims, 15 Drawing Sheets

(51) Int. Cl.
*H01L 27/108* (2006.01)
*H01L 21/761* (2006.01)
*H01L 29/06* (2006.01)

(56) References Cited

U.S. PATENT DOCUMENTS

2015/0380300 A1* 12/2015 Wu ..................... H01L 21/0337
 438/618
2018/0151735 A1* 5/2018 Chu .................. H01L 21/02532

FOREIGN PATENT DOCUMENTS

| | | |
|---|---|---|
| TW | 428257 | 4/2001 |
| TW | 200503111 | 1/2005 |
| TW | 200742086 | 11/2007 |
| TW | 201545291 | 12/2015 |

* cited by examiner

US 11,011,525 B2

LANDING PAD STRUCTURE AND METHOD OF MANUFACTURING THE SAME

CROSS-REFERENCE TO RELATED APPLICATION

This application claims the priority benefit of Taiwan application serial no. 108100253, filed on Jan. 3, 2019. The entirety of the above-mentioned patent application is hereby incorporated by reference herein and made a part of this specification.

BACKGROUND OF THE INVENTION

Field of the Invention

The present invention relates to a semiconductor memory device and a method of manufacturing the same, in particular, to a landing pad structure and a method of manufacturing the same.

Description of Related Art

With the progress of science and technology, all kinds of electronic products tend to be light, thin, and small. However, in this trend, a critical size of DRAM has also been gradually reduced, which has led to denser capacitor contacts and landing pads thereunder, and the manufacturing process has become more complicated. Therefore, those skilled in the art will work to improve an integration density of the capacitor contacts and the landing pads thereunder, simplify manufacturing steps, and reduce manufacturing costs.

SUMMARY OF THE INVENTION

The invention provides a landing pad structure and a method of manufacturing the same, which can effectively improve the integration density of the landing pads, simplify the manufacturing steps, and reduce the manufacturing costs.

The invention provides a landing pad structure including a substrate, a plurality of landing pads, a guard ring, and an edge pattern. The substrate includes a cell region, a periphery region, and a guard ring region located between the cell region and the periphery region. The landing pads are arranged on the substrate in the cell region in a hexagonal close packing (HCP) configuration. The guard ring is disposed on the substrate in the guard ring region in a strip form. The edge pattern is disposed on the substrate in the cell region and close to the guard ring region.

The invention provides a method of manufacturing the landing pad structure including the following steps. A conductive layer, a first nitrogen-containing material layer, a first carbon-containing material layer, a second nitrogen-containing material layer, a second carbon-containing material layer, and a photoresist pattern are formed sequentially on a substrate. A portion of the second carbon-containing material layer is removed by using the photoresist pattern as an etching mask, so as to form a first mask pattern. First spacers are formed on sidewalls of the first mask pattern. The first mask pattern is removed. A portion of the second nitrogen-containing material layer is removed by using the first spacer as an etching mask, so as to form the second mask pattern. A portion of the first carbon-containing material layer is removed by using the second mask pattern as an etching mask, so as to form a third mask pattern. Second spacers are formed in the third mask pattern. The third mask pattern is removed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
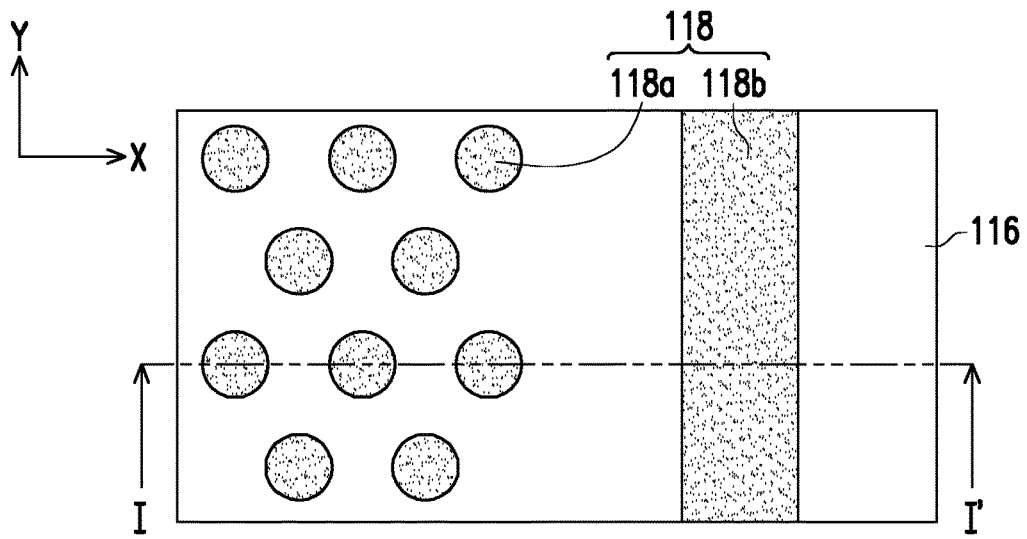
FIG. 1A to FIG. 1L are schematic top views of a manufacturing process of a landing pad structure according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 3:
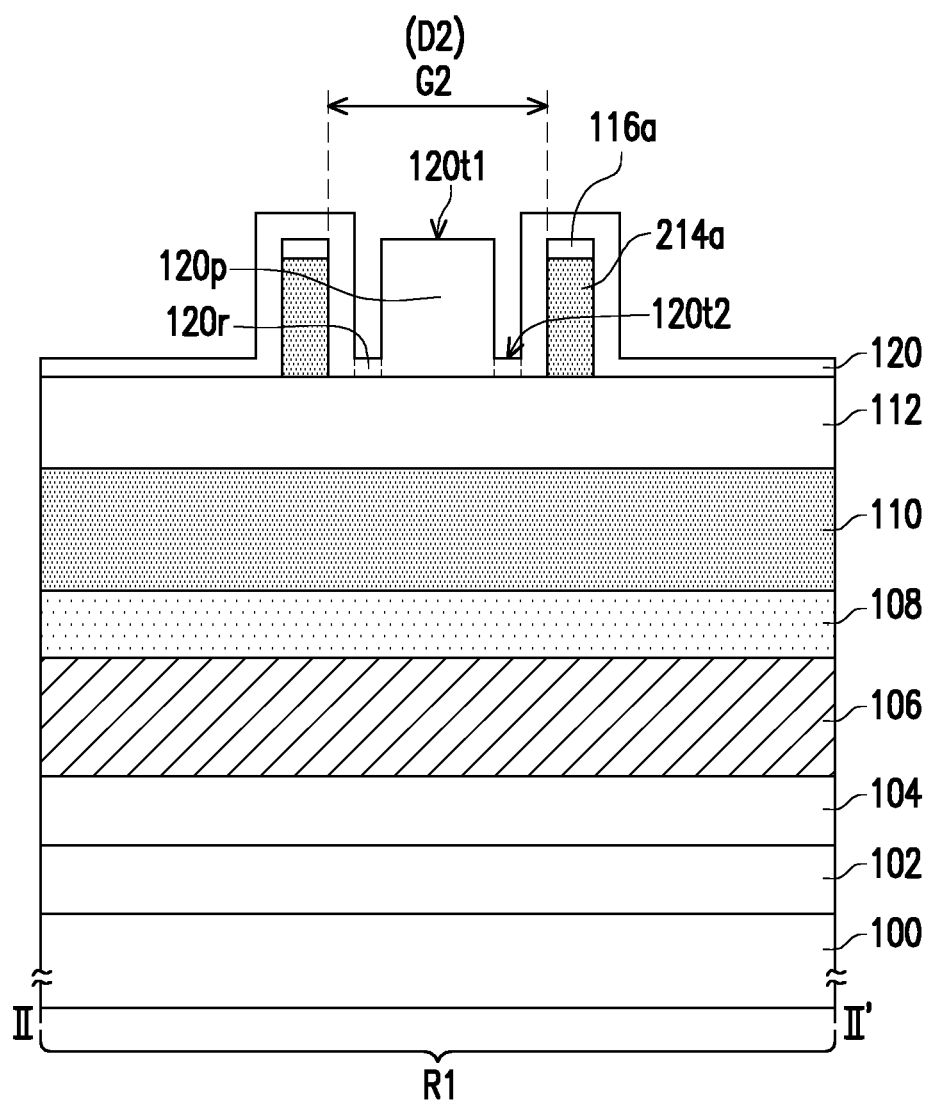
FIG. 3 is a schematic cross-sectional view taken along line II-II' of FIG. 1C.
Figure 4:
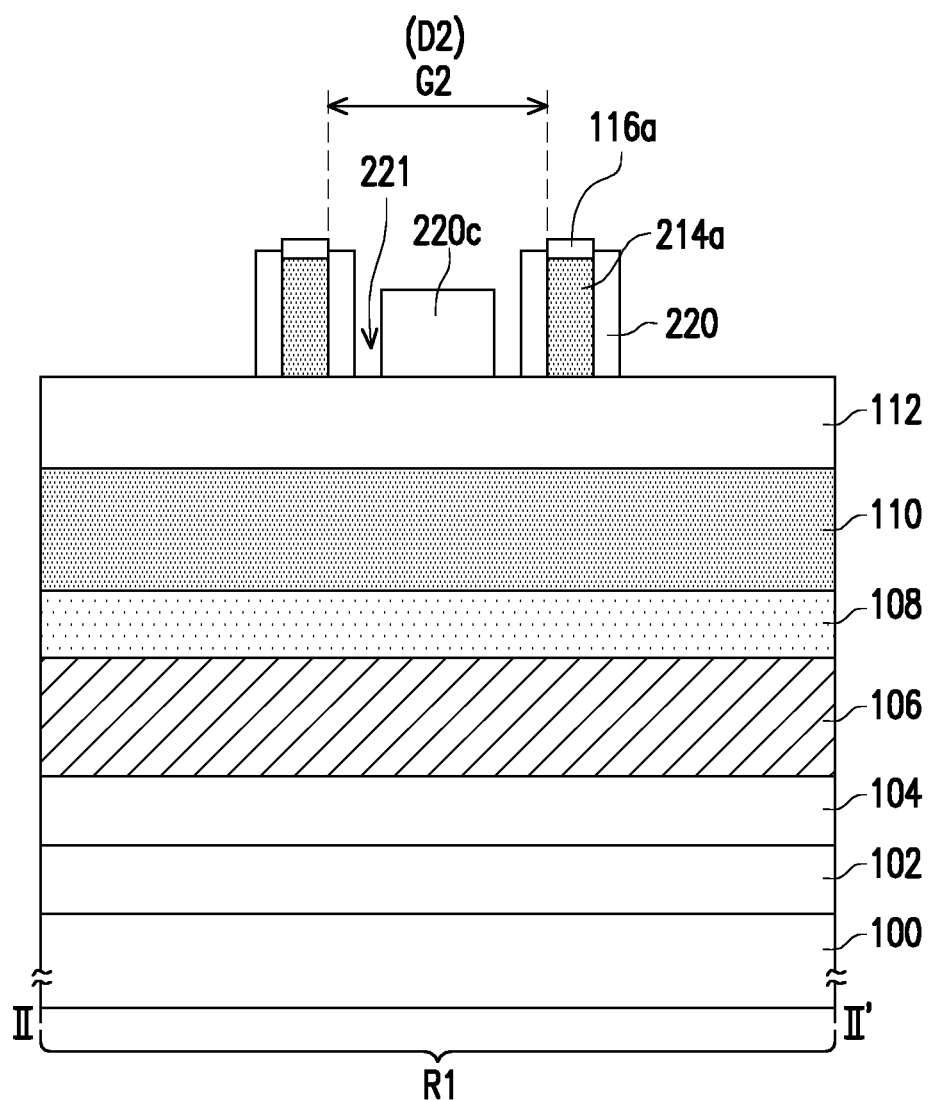
FIG. 4 is a schematic cross-sectional view taken along line II-II' of FIG. 1D.

FIG. 1A to FIG. 1L are schematic top views of a manufacturing process of a landing pad structure according to an embodiment of the invention. FIG. 2A to FIG. 2L are schematic cross-sectional views taken along line I-I' of FIG. 1A to FIG. 1L. FIG. 3 is a schematic cross-sectional view taken along line II-II' of FIG. 1C. FIG. 4 is a schematic cross-sectional view taken along line II-II' of FIG. 1D. The landing pad structure and the method of manufacturing the same illustrated in the following embodiments can be applied to a capacitor contact structure of a dynamic random access memory (DRAM), but the invention is not limited thereto.

Figure 2A:
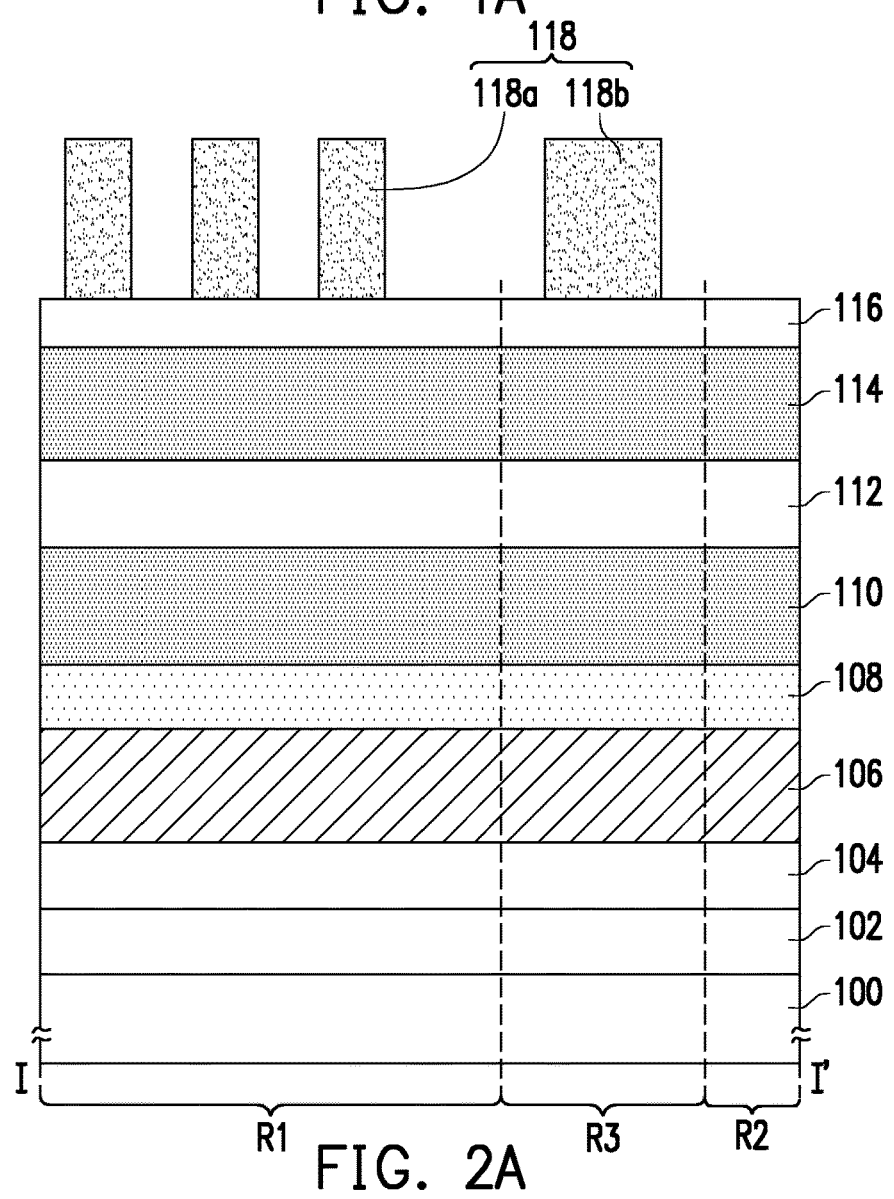
FIG. 2A to FIG. 2L are schematic cross-sectional views taken along line I-I' of FIG. 1A to FIG. 1L.

Referring to FIG. 1A and FIG. 2A, a method of manufacturing the landing pad structure includes the following steps in the present embodiment. First, a substrate 100 is provided. In an embodiment, a material of the substrate 100 is at least one material selected from the group consisting of Si, Ge, SiGe, GaP, GaAs, SiC, SiGeC, InAs, and InP, for example. In alternative embodiments, the substrate 100 may be a semiconductor-on-insulator (SOI) substrate. In the present embodiment, the substrate 100 is a silicon substrate.

Particularly, as shown in FIG. 2A, the substrate 100 includes a cell region R1, a periphery region R2, and a guard ring region R3 located between the cell region R1 and the periphery region R2. In an embodiment, the cell region R1 may have a plurality of memory cells (e.g., flash memory, DRAM, SRAM) therein; the periphery region R2 may have a plurality of logic circuits (e.g., transistors) therein; and the guard ring region R3 has a guard ring therein. In other embodiments, the periphery region R2 may also have a memory therein. In alternative embodiments, the guard ring region R3 surrounds the cell region R1 to protect the memory cells in the cell region R1 from being damaged, such as electrostatic discharge (ESD).

As shown in FIG. 2A, a composite layer stack is formed on the substrate 100, which includes a pad oxide layer 102, a barrier layer 104, a conductive layer 106, a first nitrogen-containing material layer 108, a first carbon-containing material layer 110, a second nitrogen-containing material layer 112, a second carbon-containing material layer 114, an anti-reflection layer 116, and a photoresist pattern 118 sequentially from bottom to top.

In an embodiment, the pad oxide layer 102 may be a silicon oxide layer having a thickness of about 3 nm to 5 nm, which may be formed by chemical vapor deposition (CVD), furnace oxidation, or the like. In an embodiment, a material of the barrier layer 104 includes metal (e.g., Ti, Ta, or the like), metal silicide (e.g., TiN, TaN, or the like), or a combination thereof, and the barrier layer 104 has a thickness of about 3 nm to 6 nm, which may be formed by physical vapor deposition (PVD), CVD, or the like. In an embodiment, a material of the conductive layer 106 includes a conductive material, such as metal (e.g., W, Cu, AlCu), or the like, polysilicon, silicon germanium, or a combination thereof, and the conductive layer 106 has a thickness of about 15 nm to 40 nm, which may be formed by PVD, CVD, or the like. In an embodiment, a material of the first nitrogen-containing material layer 108 includes nitride, such as silicon nitride, silicon oxynitride, or a combination thereof, and the first nitrogen-containing material layer 108 has a thickness of about 30 nm to 50 nm, which may be formed by CVD, atomic layer deposition (ALD), or the like. In an embodiment, a material of the first carbon-containing material layer 110 and the second carbon-containing material layer 114 respectively includes carbide, such as diamond-like carbon (DLC), an amorphous carbon film (APF), a high selectivity transparency (HST) film, or a combination thereof. The first carbon-containing material layer 110 and the second carbon-containing material layer 114 respectively have a thickness of about 70 nm to 100 nm, which may be formed by CVD. In an embodiment, a material of the second nitrogen-containing material layer 112 includes nitride, such as silicon nitride, silicon oxynitride, or a combination thereof, and the second nitrogen-containing material layer 112 has a thickness of about 60 nm to 80 nm, which may be formed by CVD. In an embodiment, a material of the anti-reflection layer 116 includes organic polymers, carbon, silicon oxynitride, or the like, and the anti-reflection layer 116 has a thickness of about 20 nm to 30 nm, which may be formed by CVD. In an embodiment, a material of the photoresist pattern 118 includes a positive type photoresist, a negative type photoresist, or the like, and the photoresist pattern 118 may be formed by a spin coating method and a development process.

It should be noted that, as shown in FIG. 1A, the photoresist pattern 118 includes photoresist patterns 118a and 118b. The photoresist pattern 118a includes a plurality of island patterns separated from each other in the cell region R1, and the photoresist pattern 118b includes a strip pattern extending along a Y direction in the guard ring region R3.

Figure 1B:
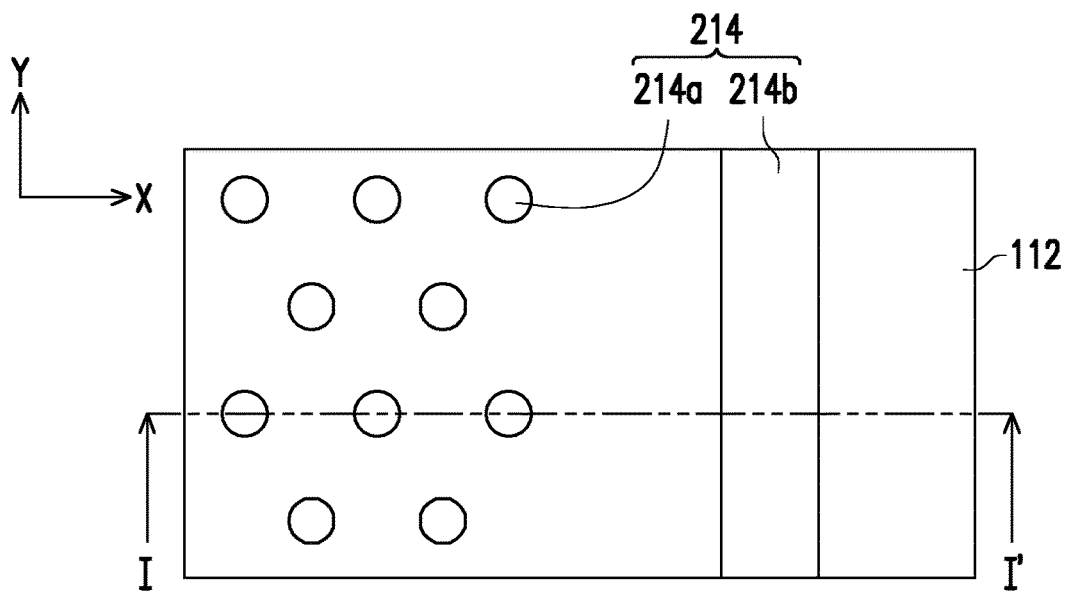
Figure 2B:
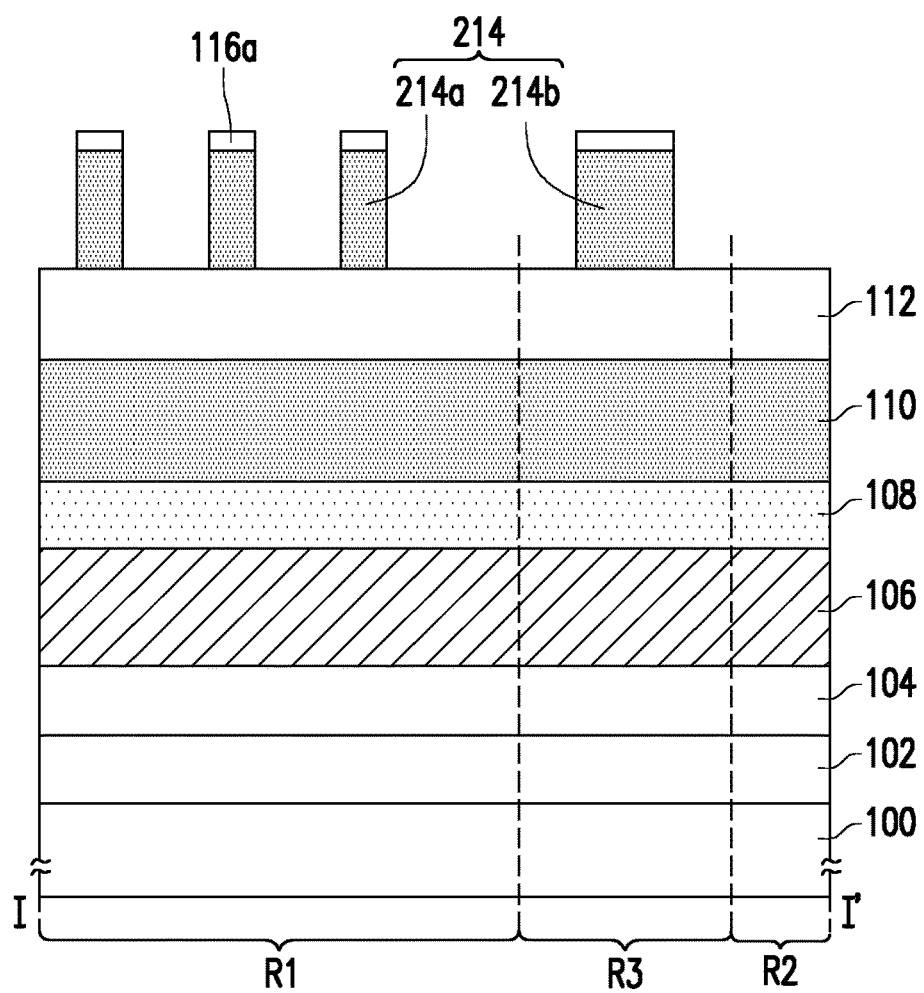

Referring to FIG. 1A to FIG. 1B and FIG. 2A to FIG. 2B, a portion of the anti-reflection layer 116 and a portion of the second carbon-containing material layer 114 are removed by using the photoresist pattern 118 as an etching mask so as to form a first mask pattern 214. In this case, as shown in FIG. 1B, the first mask pattern 214 copies the photoresist pattern 118, which also includes first mask patterns 214a and 214b. The first mask pattern 214a includes a plurality of island patterns separated from each other in the cell region R1, and the first mask pattern 114b includes a strip pattern extending along the Y direction in the guard ring region R3. In the present embodiment, the second nitrogen-containing material layer 112 may be used as an etching stop layer for forming the first mask pattern 214. That is, the second nitrogen-containing material layer 112 is not substantially removed or only a small amount of the second nitrogen-containing material layer 112 is removed when the portion of the second carbon-containing material layer 114 is removed. Additionally, as shown in FIG. 2B, a portion of the anti-reflection layer 116a still remains on a top surface of the first mask pattern 214.

Figure 1C:
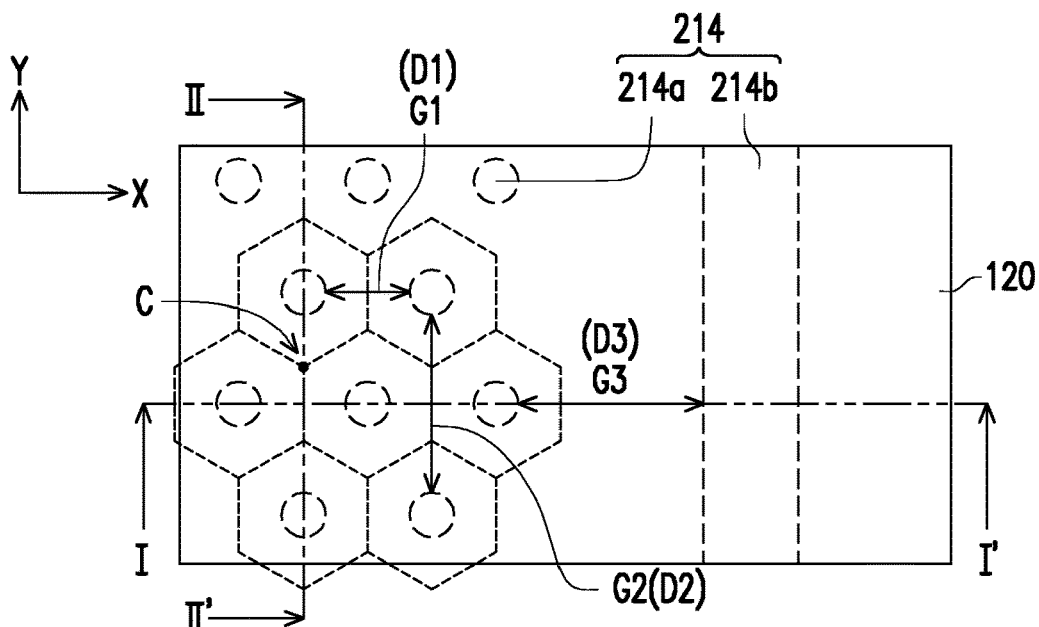
Figure 2C:
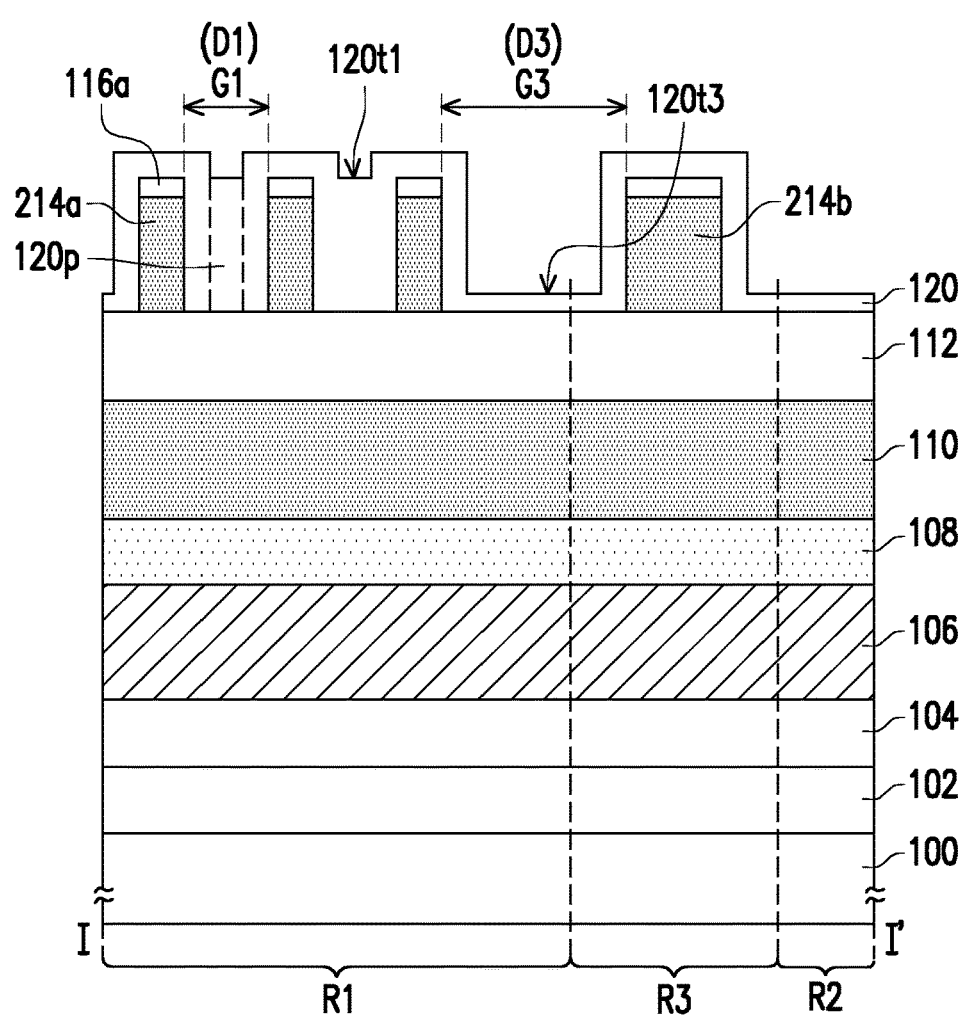

Referring to FIG. 1C, FIG. 2C, and FIG. 3, a first spacer material 120 is formed on the substrate 100 to conformally cover the top surface and sidewalls of the first mask pattern 214. In an embodiment, the first spacer material 120 includes a dielectric material, such as silicon oxide, silicon nitride, silicon oxynitride, or a combination thereof, and the first spacer material 120 has a thickness of about 30 nm to 50 nm, which may be formed by ALD.

It should be noted that, as shown in FIG. 1C, the first mask pattern 214a in the cell region R1 is a pillar pattern (from the cross-sectional view of FIG. 2C) or an island pattern (from the top view of FIG. 1C) arranged in the hexagonal closed packing configuration. Particularly, a distance D1 of a gap G1 between two adjacent first mask patterns 214a along an X direction is smaller than a distance D2 of a gap G2 between two adjacent first mask patterns 214a along the Y direction. In this case, as shown in FIG. 2C and FIG. 3, the first spacer material 120 has a protrusion portion 120p and a recess portion 120r. The protrusion portion 120p is located in the gap G1 between the two adjacent first mask patterns 214a; and the recess portions 120r are located at two sides of the protrusion portion 120p, as shown in FIG. 3. A top surface 120t1 of the protrusion portion 120p is higher than a top surface 120t2 of the recess portion 120r. In an embodiment, as shown in FIG. 1C, the recess portion 120r corresponds to a centroid C between three adjacent first mask patterns 214.

On the other hand, the distance D1 of the gap G1 between the two adjacent first mask patterns 214a along the X direction is also smaller than a distance D3 of a gap G3 between the first mask patterns 214a and 214b along the X direction. In this case, as shown in FIG. 2C, the first spacer material 120 fills up the gap G1 without filling up the gap G3. Thus, the top surface 120t1 of the first spacer material 120 filled in the gap G1 is higher than a top surface 120t3 of the first spacer material 120 filled in the gap G3.

Figure 1D:
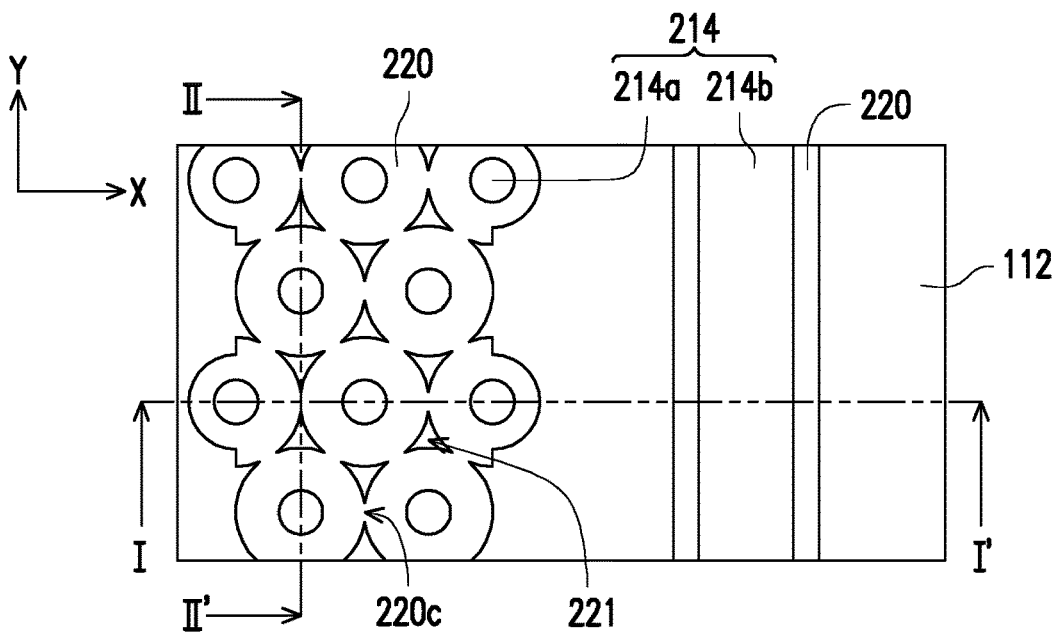
Figure 2D:
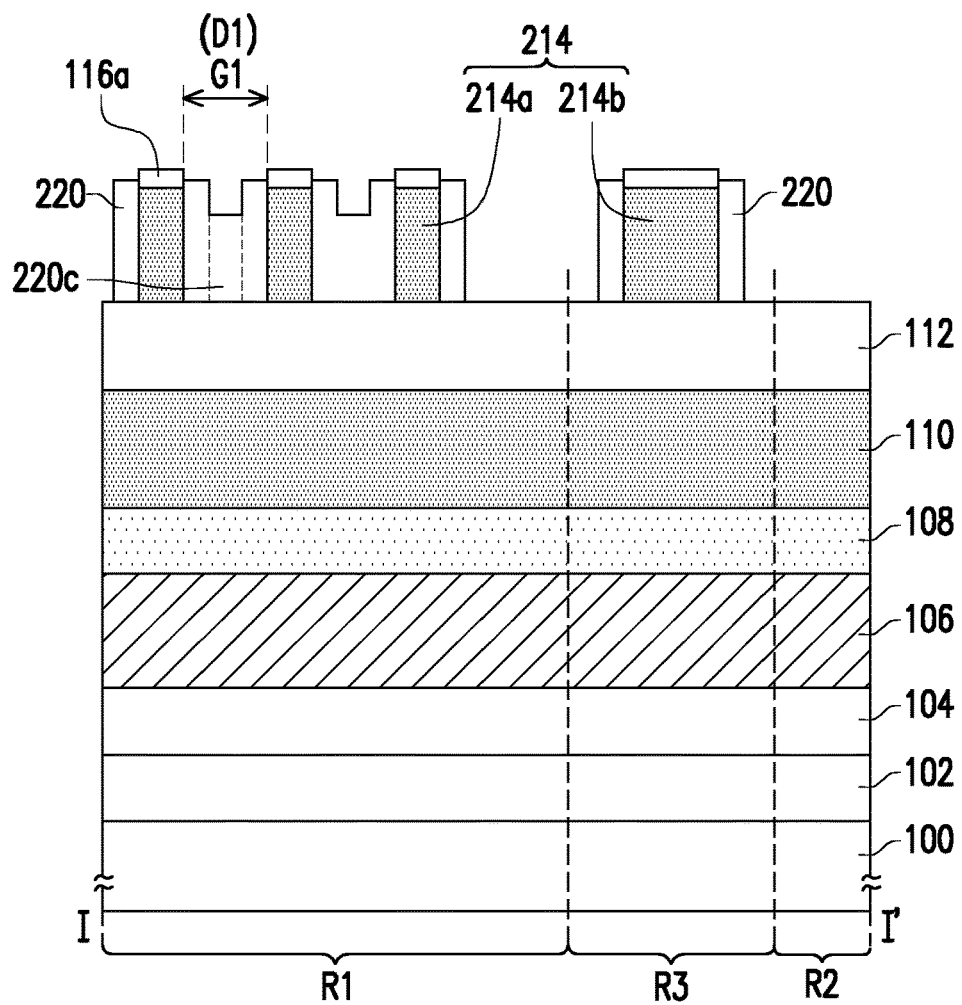
Figure 2E:
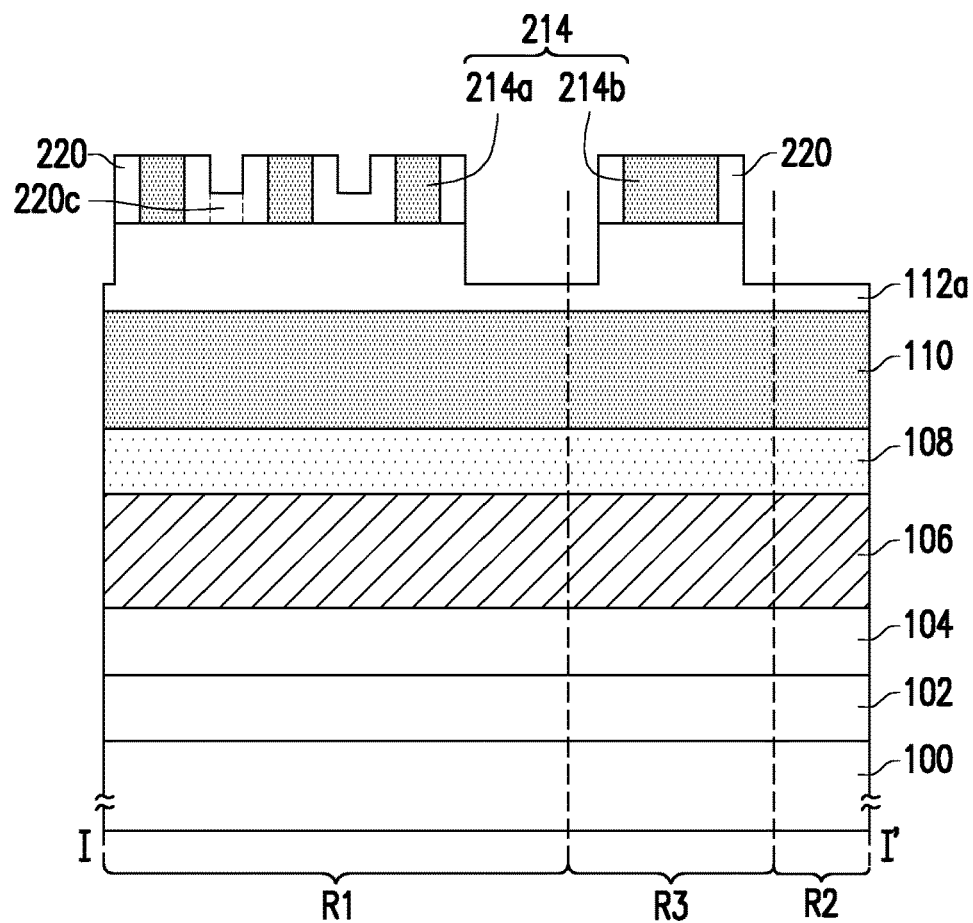
Figure 2F:
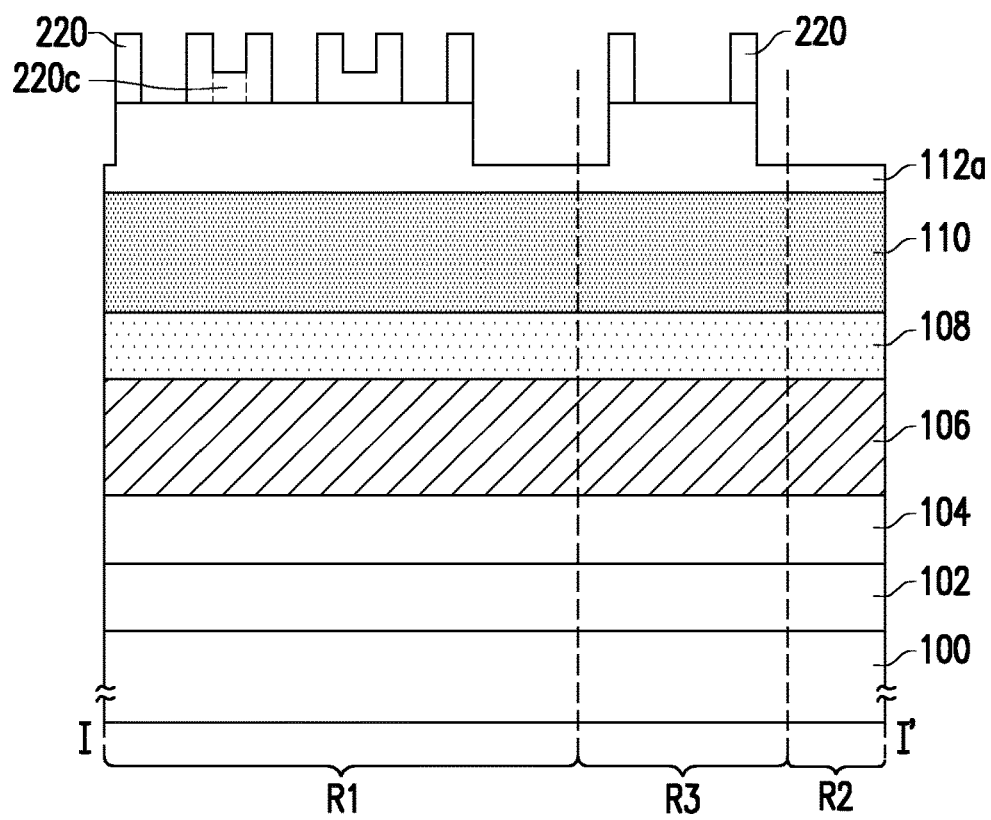

Referring to FIG. 1C to FIG. 1D, FIG. 2C to FIG. 2D, and FIG. 3 to FIG. 4, an etching process is performed to remove a portion of the first spacer material 120, so as to expose the anti-reflection layer 116a on the first mask pattern 214 and the second nitrogen-containing material layer 112. In this case, as shown in FIG. 2D and FIG. 4, first spacers 220 are formed on sidewalls of the first mask pattern 214. A height of the protrusion portion 120p (as shown in FIG. 2C) is lowered to form a connection portion 220c connecting the first spacers 220 in the gap G1 between the two adjacent first mask patterns 214a in the X direction. Additionally, the recess portion 120r (as shown in FIG. 3) is also removed to expose the second nitrogen-containing material layer 112, so as to form notches 221 at both sides of the connection portion 220c (as shown in FIG. 4). That is, the first spacers 220 in the gap G2 between the two adjacent first mask patterns 214a in the Y direction are separated from each other. In an embodiment, the aforementioned etching process may be an anisotropic etching process, such as a reactive ion etching (RIE) process. In another embodiment, the aforementioned etching process may be a dry etching process.

Referring to FIG. 1E to FIG. 1F and FIG. 2E to FIG. 2F, the anti-reflection layer 116a is removed to expose the first mask pattern 214. In this case, a portion of the second nitrogen-containing material layer 112 not covered by the first mask pattern 214 and the first spacers 220 is also removed. Then, the first mask pattern 214 is removed to expose the second nitrogen-containing material layer 112a thereunder.

Figure 1E:
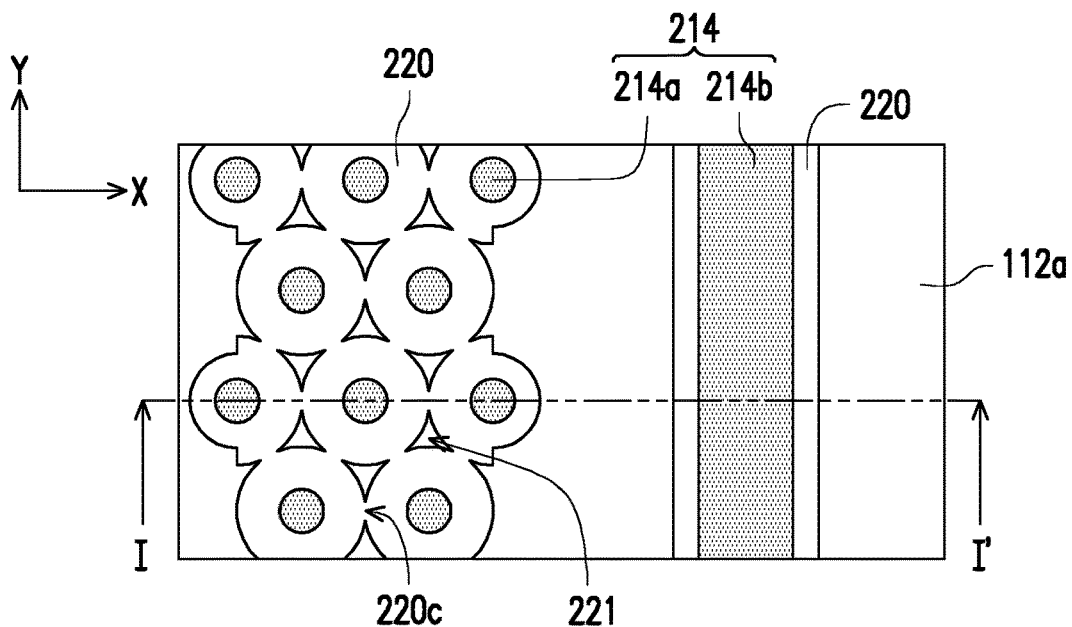
Figure 1F:
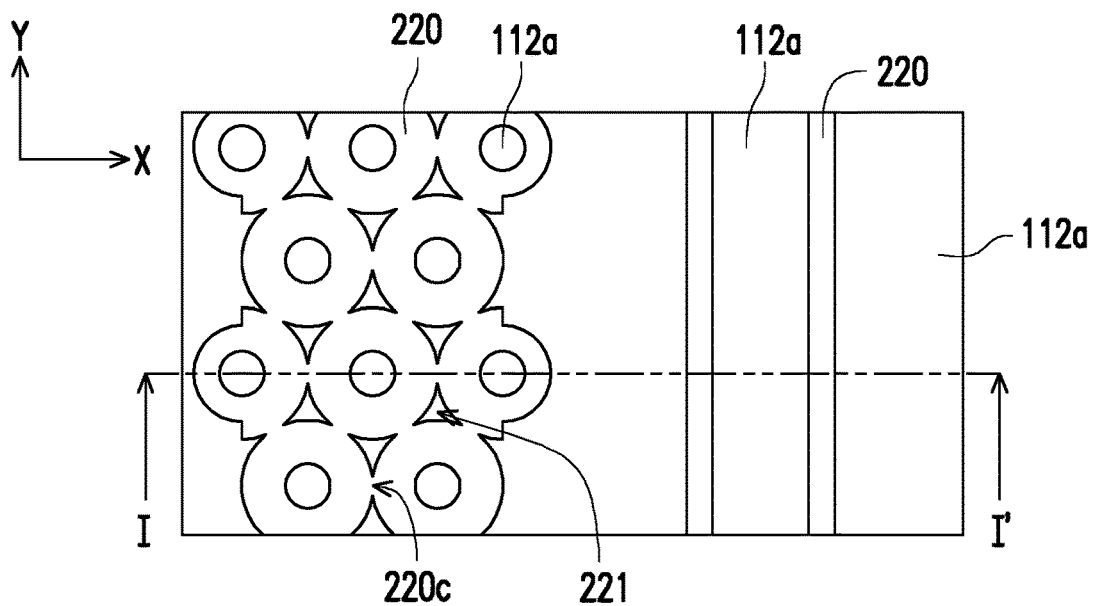
Figure 1G:
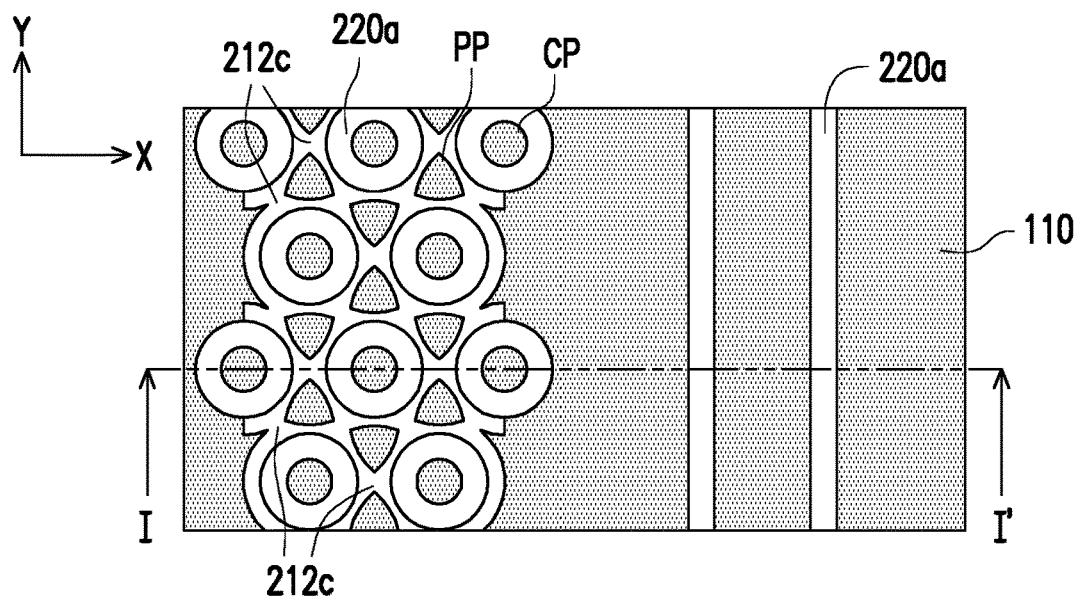
Figure 2G:
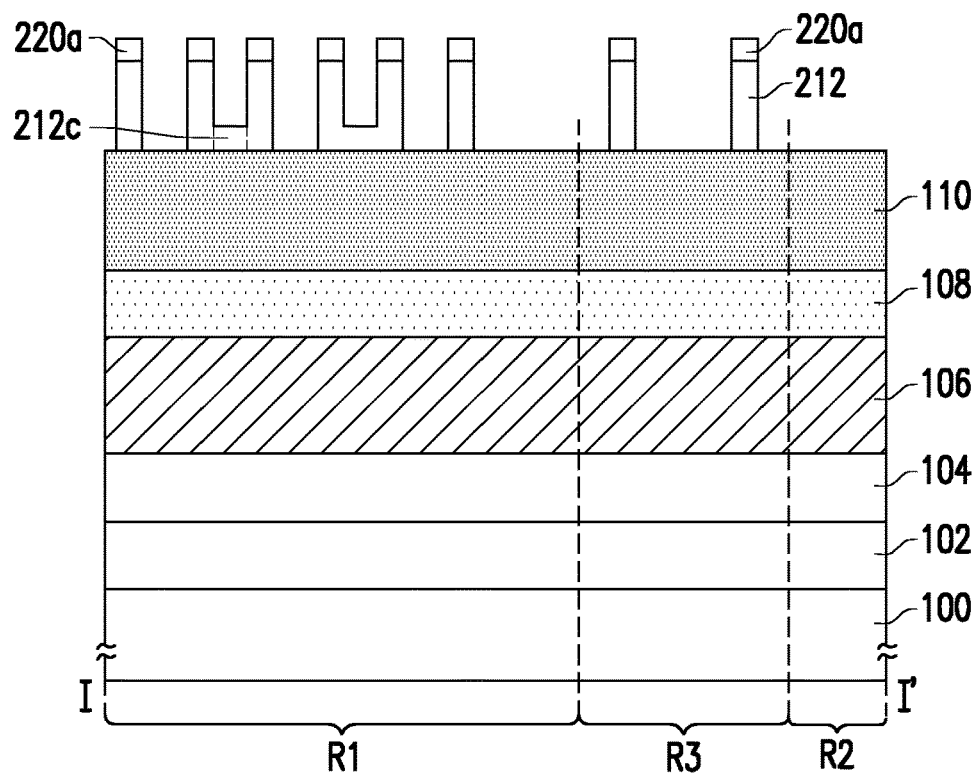

Referring to FIG. 1F to FIG. 1G and FIG. 2F to FIG. 2G, a portion of the second nitrogen-containing material layer 112a is removed by using the first spacers 220 as an etching mask, so as to form a second mask pattern 212. In this case, as shown in FIG. 1G and FIG. 2G, the first carbon-containing material layer 110 may be regard as an etching stop layer for removing the second nitrogen-containing material layer 112a, so that the first carbon-containing material layer 110 is exposed by the second mask pattern 212. Additionally, a connection portion 212c is provided between the two adjacent second mask patterns 212 along the X direction to connect the two adjacent second mask patterns 212 along the X direction. Further, a portion of the first spacer 220a still remains on the second mask pattern 212.

In an embodiment, the manufacturing method by forming the first spacers 220 on the sidewalls of the first mask pattern 214 and using the first spacer 220 as the etching mask to increase the pattern density or the feature density may be called a self-alignment double patterning (SADP) process. Particularly, after the SADP process is performed, as shown in FIG. 1G, at least six periphery patterns PP are added around a single center pattern CP (which corresponds to the first mask pattern 214a of FIG. 1C). In other words, the SADP process may increase the integration density of the pattern density or the feature density to overcome the limitation of the resolution of the light source in the current lithography process.

Figure 1H:
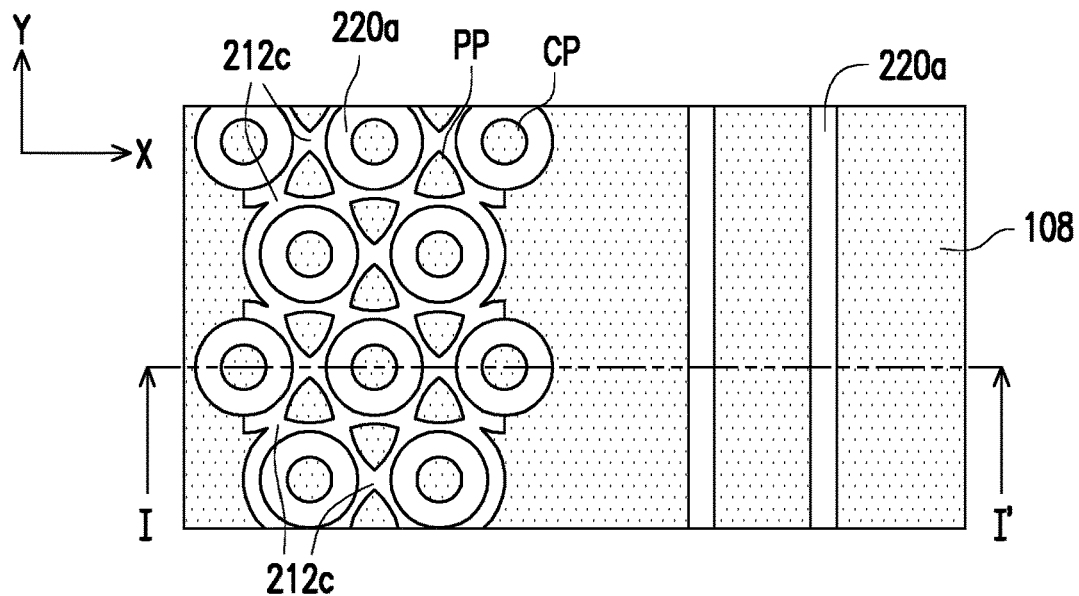
Figure 2H:
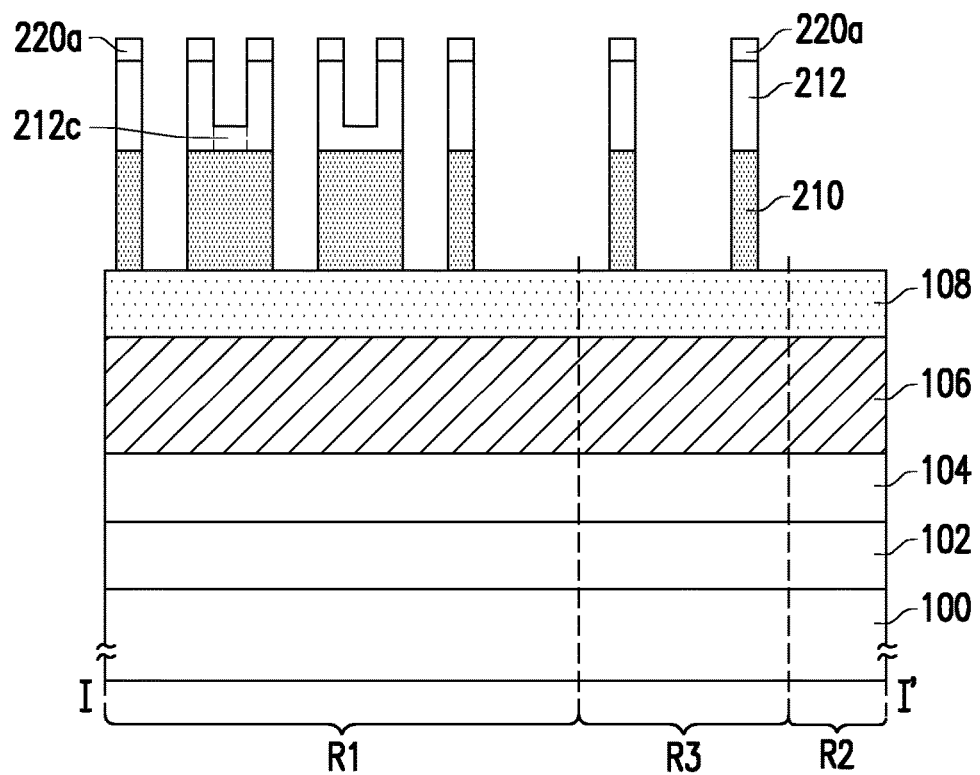
Figure 2I:
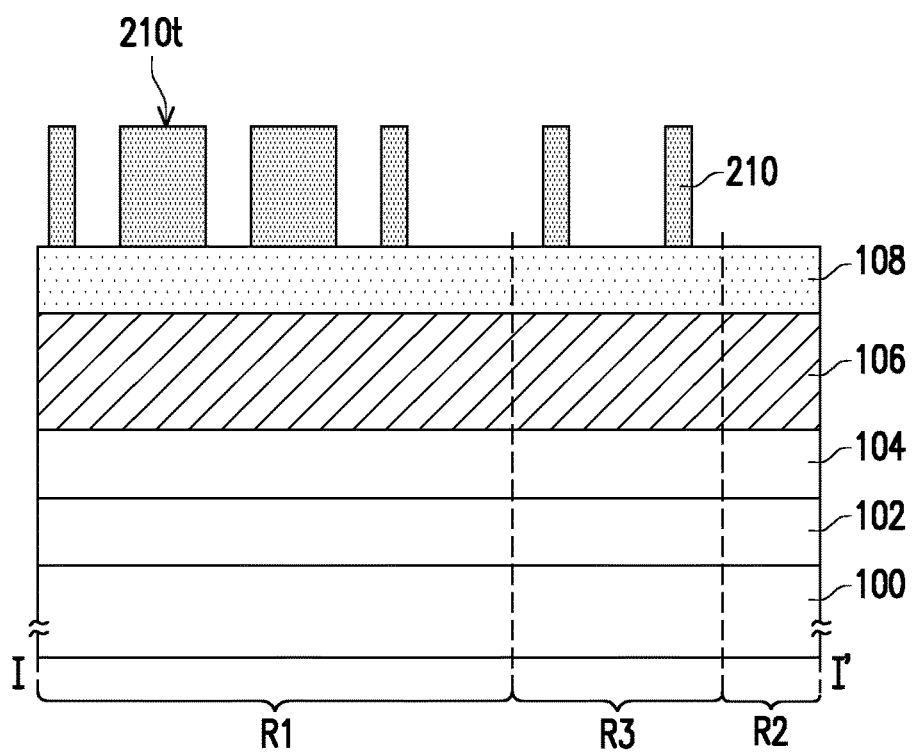

Referring to FIG. 1G to FIG. 1H and FIG. 2G to FIG. 2H, a portion of the first carbon-containing material layer 110 is removed by using the second mask pattern 212 as an etching mask, so as to form a third mask pattern 210. In this case, as shown in FIG. 1H and FIG. 2H, the first nitrogen-containing material layer 108 may be regard as an etching stop layer for removing the first carbon-containing material layer 110, so that the first nitrogen-containing material layer 108 is exposed by the third mask pattern 210. It should be noted that, when the materials of the second mask pattern 212 and the first nitrogen-containing material layer 108 are both silicon nitride, a density of the first nitrogen-containing material layer 108 is greater than a density of the second mask pattern 212. That is, the first nitrogen-containing material layer 108 may be used as an etching stop layer for removing the first carbon-containing material layer 110 without loss or only slight loss the first nitrogen-containing material layer 108.

Referring to FIG. 1H to FIG. 1I and FIG. 2H to FIG. 2I, the second mask pattern 212 and the first spacer 220a on the third mask pattern 210 are removed by performing a wet etching process to expose a top surface 210t of the third mask pattern 210.

Figure 1I:
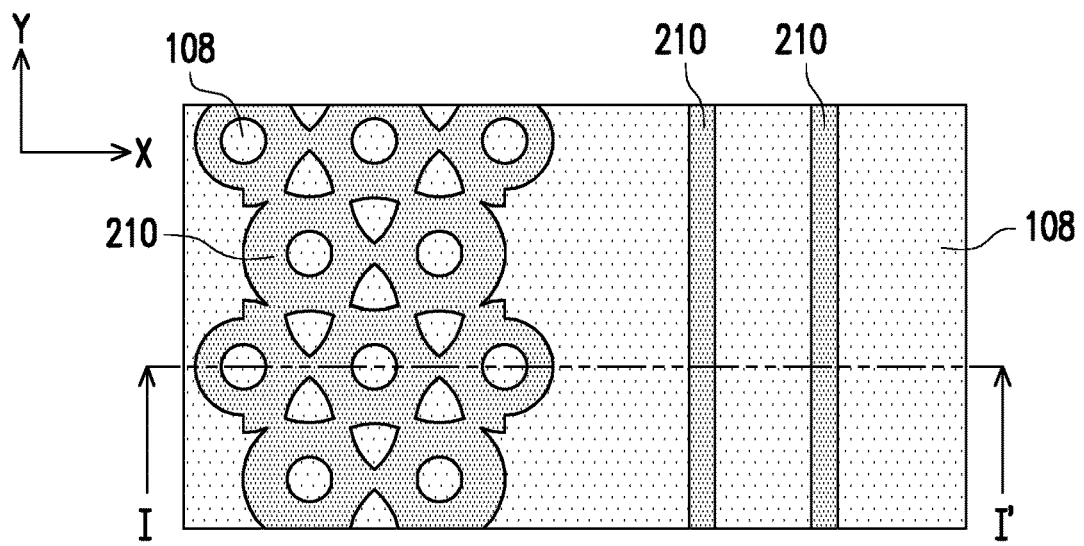
Figure 1J:
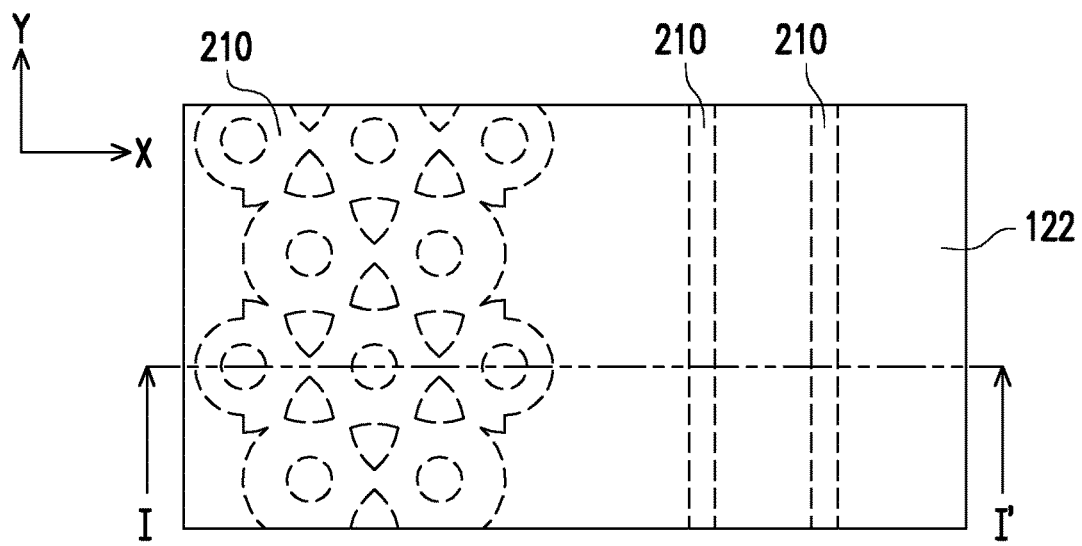
Figure 2J:
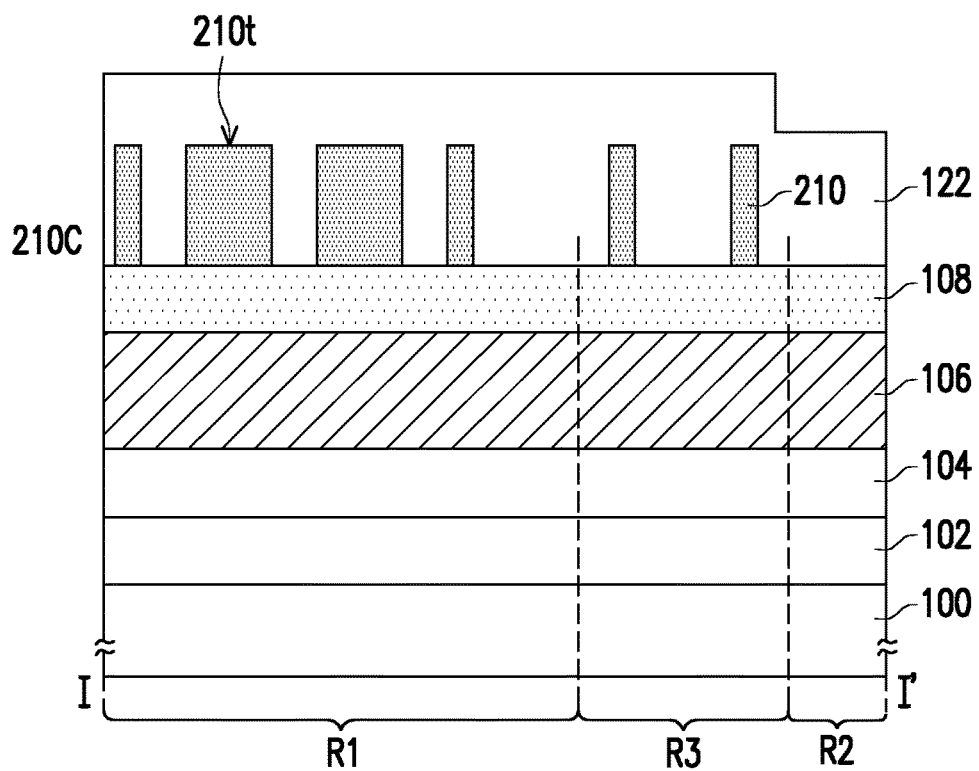
Figure 1K:
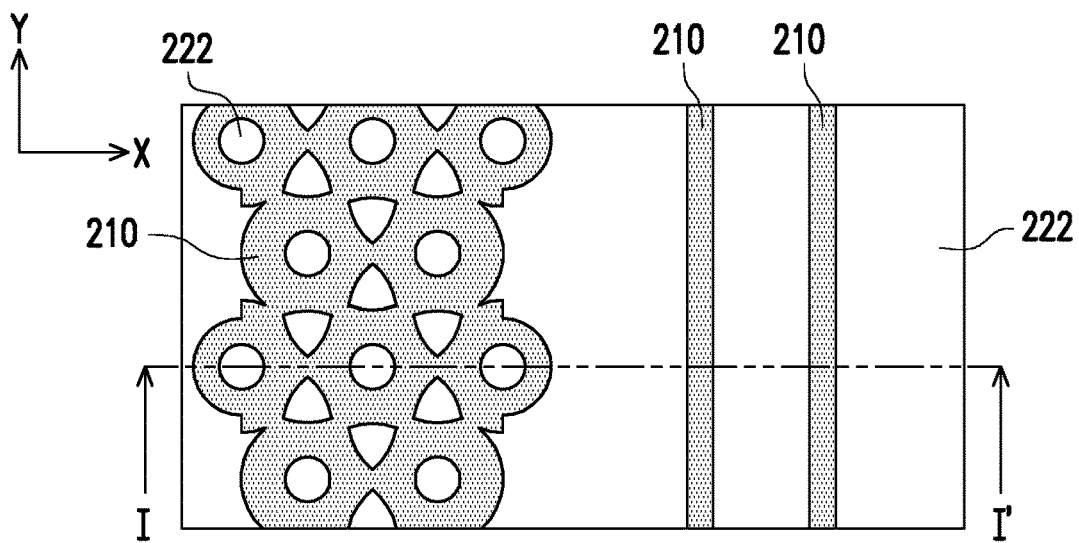

Referring to FIG. 1J and FIG. 2J, a second spacer material 122 is formed on the first nitrogen-containing material layer 108. As shown in FIG. 2J, the second spacer material 122 covers the top surface 210t of the third mask pattern 210 and fills in the gap between the third mask patterns 210. In an embodiment, the second spacer material 122 includes a dielectric material, such as silicon oxide, silicon nitride, silicon oxynitride, or a combination thereof, and the second spacer material 122 having a thickness of about 40 nm to 50 nm, which may be formed by CVD or ALD.

Figure 2K:
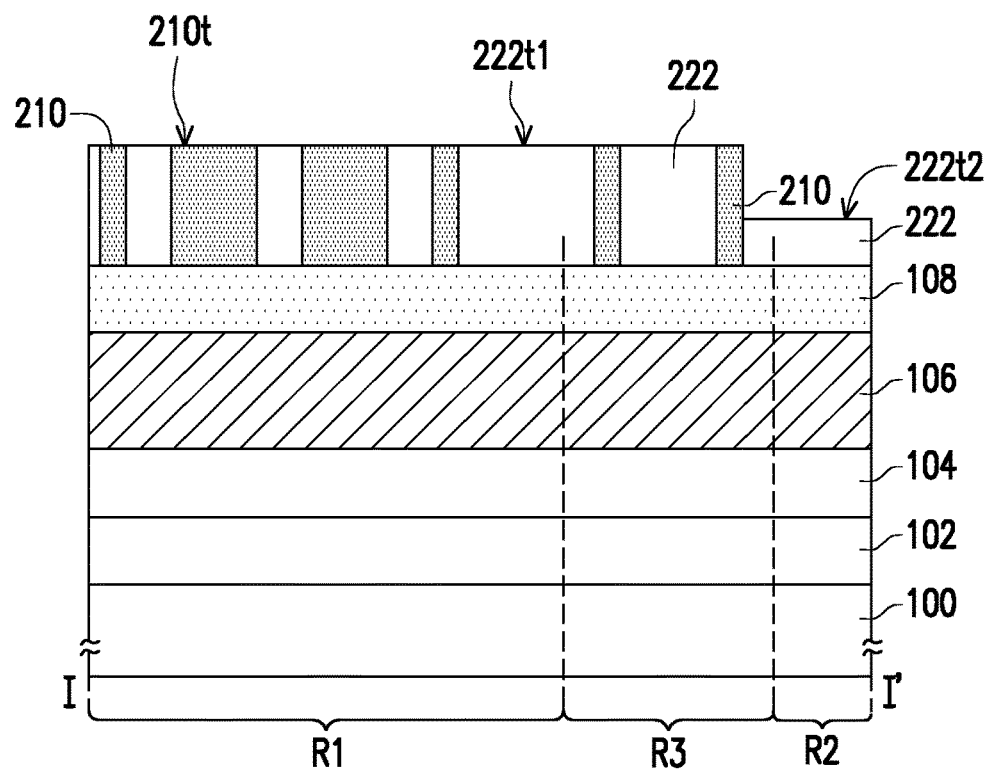

Referring to FIG. 1J to FIG. 1K and FIG. 2J to FIG. 2K, an etch back process is then performed on the second spacer material 122 to remove a portion of the second spacer material 122, so as to expose the top surface 210t of the third mask pattern 210. In this case, as shown in FIG. 2K, a second spacer 222 is formed in the third mask pattern 210, and a top surface 222t1 of the second spacer 222 in the cell region R1 and the top surface 210t of the third mask pattern 210 are substantially coplanar. On the other hand, a top surface 222t2 of the second spacer 222 in the periphery region R2 is lower than the top surface 222t1 of the second spacer 222 in the cell region R1.

Figure 1L:
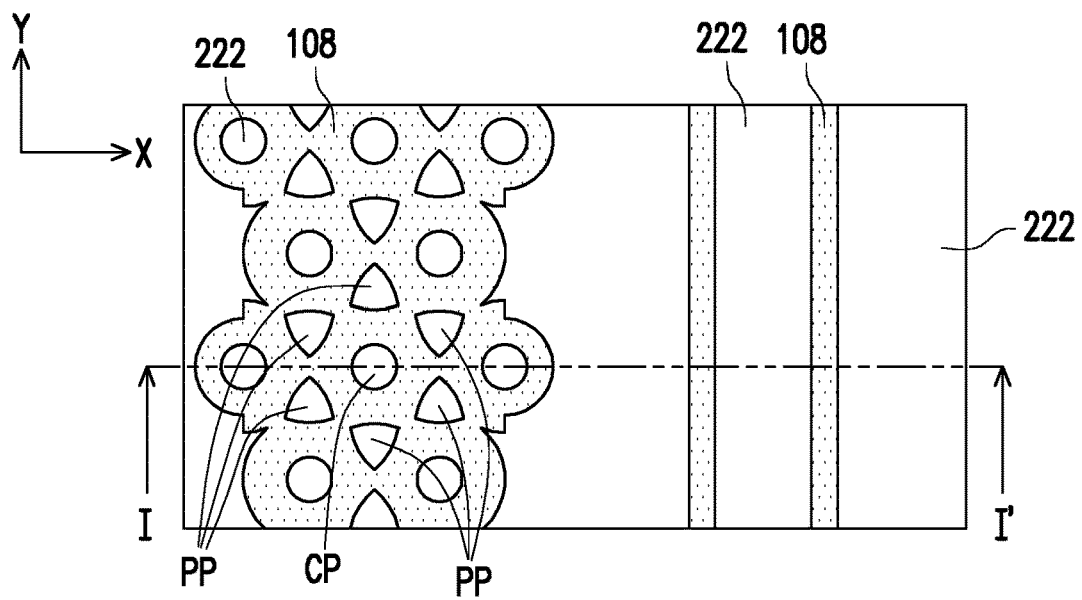
Figure 2L:
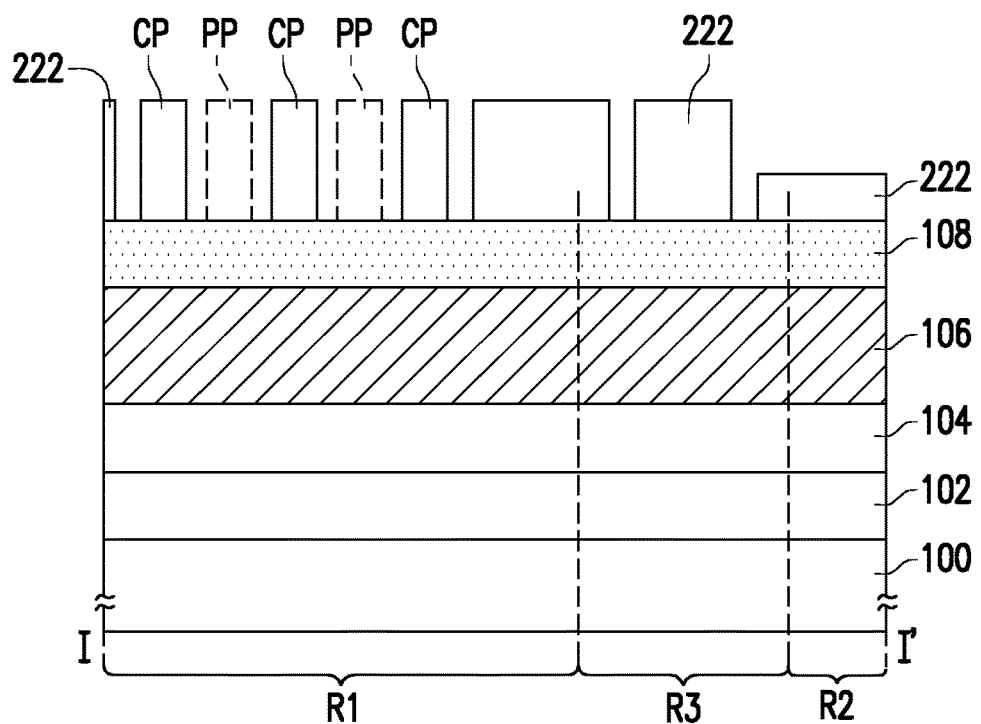

Referring to FIG. 1K to FIG. 1L and FIG. 2K to FIG. 2L, the third mask pattern 210 is removed to expose a top surface of the first nitrogen-containing material layer 108. In this case, as shown in FIG. 2L, the second spacer 222 remaining on the first nitrogen-containing material layer 108 may be used as an etching mask to pattern the underlying first nitrogen-containing material layer 108 and the conductive layer 106, so as to form a plurality of landing pads on the substrate 100 in the cell region R1, and form a guard ring on the substrate 100 in the guard ring region R3. That is, the patterned conductive layer 106 in the cell region R1 may be used as the landing pad; and the patterned conductive layer 106 in the guard ring region R3 may be used as the guard ring. In an embodiment, the landing pads and the guard ring are simultaneously formed and have the same material.

It should be noted that, after patterning the conductive layer 106 to form the landing pad, the shape of the landing pads includes the center pattern CP and the periphery patterns PP from a top view. As shown in FIG. 1L, the six periphery patterns PP surround one single center pattern CP. In an embodiment, the center pattern CP is formed by a multiple patterning process, thus it presents a circle or a quasi-circle in the top view. In another embodiment, the method of forming the periphery pattern PP includes the following steps. The first mask patterns 214a is arranged in the hexagonal close packing configuration, and the notch 221 is formed in the gap G2 between the two adjacent first mask patterns 214a in the Y direction (as shown in FIG. 1D and FIG. 4), thereby patterning a stack structure below the notch 221. In the case, the periphery pattern PP presents a triangle or a quasi-triangle. That is, the periphery pattern PP is different from the conventional patterned circular structure or circular pattern. In alternative embodiments, as shown in FIG. 1L, the six periphery patterns PP are arranged in a radial form with the center pattern CP as a center.

Figure 5:
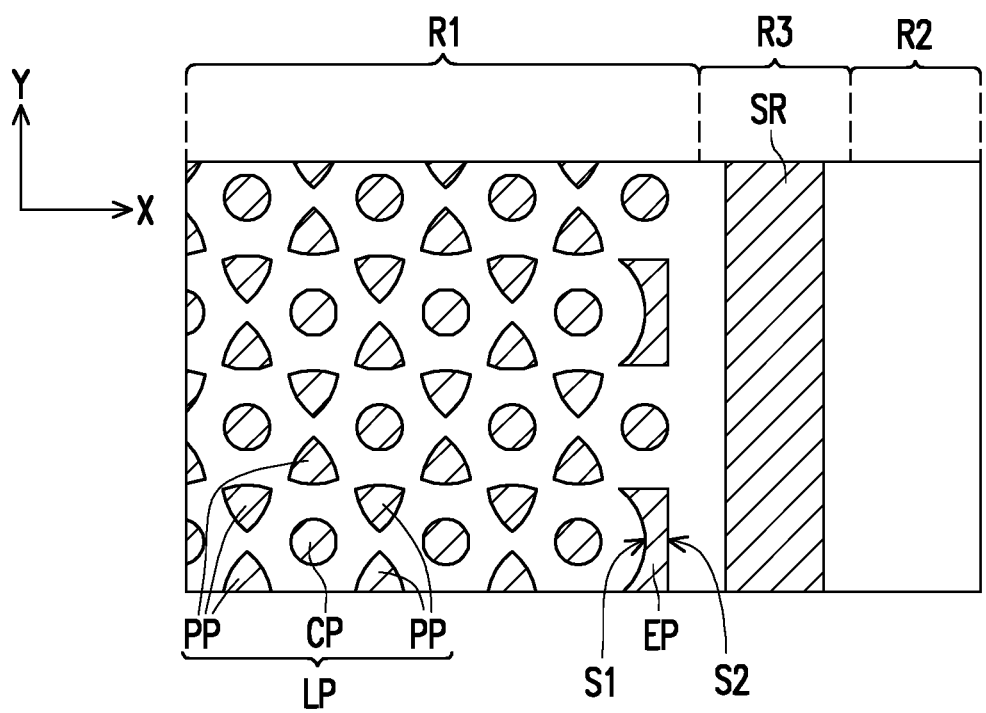
FIG. 5 is a schematic top view of a landing pad structure according to another embodiment of the invention.

FIG. 5 is a schematic top view of a landing pad structure according to another embodiment of the invention.

Referring to FIG. 5, basically, the shape of FIG. 5 is similar to the shape of FIG. 1L, and the difference between the two is that, the two periphery patterns PP close to the guard ring region R3 are connected to each other to form an edge pattern EP in the cell region R1 in FIG. 5. In an embodiment, from a top view, the landing pad LP (or a capacitor contact structure) includes the center patterns CP and the periphery patterns PP. As shown in FIG. 5, a side S1 of the edge pattern EP close to the landing pad LP (or the center pattern CP) is curved or arced; a side S2 close to the guard ring SR (or the guard ring region R3) is linear or straight. In alternative embodiments, the landing pad LP, the guard ring SR, and the edge pattern EP are simultaneously formed and have the same material, such as tungsten (W). In other embodiments, the edge pattern EP may also be used as the landing pad, and the capacitor contact and the capacitor are formed thereon.

In summary, in the present invention, a plurality of landing pads, the guard ring, and the edge pattern are simultaneously formed by the composite layer stack with the double patterning process. The plurality of landing pads are arranged in the hexagonal close packing configuration, which is able to effectively improve the integration density of the landing pads. The composite layer stack and the double patterning process is able to significantly reduce the manufacturing steps and the manufacturing costs.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a landing pad structure, comprising:
    forming a conductive layer, a first nitrogen-containing material layer, a first carbon-containing material layer, a second nitrogen-containing material layer, a second carbon-containing material layer, and a photoresist pattern sequentially on a substrate;
    removing a portion of the second carbon-containing material layer by using the photoresist pattern as an etching mask, so as to form a first mask pattern;
    forming first spacers on sidewalls of the first mask pattern;
    removing the first mask pattern;
    removing a portion of the second nitrogen-containing material layer by using the first spacers as an etching mask, so as to form a second mask pattern;
    removing a portion of the first carbon-containing material layer by using the second mask patterns as an etching mask, so as to form a third mask pattern;
    forming second spacers in the third mask pattern; and
    removing the third mask pattern.

2. The method of manufacturing the landing pad structure according to claim 1, wherein the substrate comprises a cell region, a periphery region, and a guard ring region located between the cell region and the periphery region.

3. The method of manufacturing the landing pad structure according to claim 2, wherein the first mask pattern formed in the cell region comprises a plurality of pillar patterns arranged in a hexagonal close packing configuration.

4. The method of manufacturing the landing pad structure according to claim 3, wherein the first spacers between the pillar patterns along an X direction are connected to each other, and the first spacers between the pillar patterns along a Y direction are separated from each other.

5. The method of manufacturing the landing pad structure according to claim 2, further comprising: removing a portion of the first nitrogen-containing material layer and a portion of the conductive layer by using the second spacer as an etching mask, so as to form a plurality of landing pads on the substrate in the cell region.

6. The method of manufacturing the landing pad structure according to claim 5 wherein the step of forming the plurality of landing pads on the substrate in the cell region further comprises:
    forming a guard ring on the substrate in the guard ring region; and
    forming an edge pattern on the substrate in the cell region and close to the guard ring region.

7. The method of manufacturing the landing pad structure according to claim 6, wherein the plurality of landing pads, the guard ring, and the edge pattern are simultaneously formed and have the same material.

* * * * *